United States Patent
Nabatame

(10) Patent No.: US 8,168,547 B2
(45) Date of Patent: May 1, 2012

(54) MANUFACTURING METHOD OF SEMICONDUCTOR DEVICE

(75) Inventor: Toshihide Nabatame, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/752,828

(22) Filed: Apr. 1, 2010

(65) Prior Publication Data

US 2010/0187644 A1    Jul. 29, 2010

Related U.S. Application Data

(63) Continuation of application No. 12/116,940, filed on May 7, 2008, now abandoned.

(30) Foreign Application Priority Data

May 15, 2007  (JP) .................. 2007-128692

(51) Int. Cl.
*H01L 21/31* (2006.01)
*H01L 21/469* (2006.01)
(52) U.S. Cl. . 438/783; 438/785; 257/411; 257/E29.132; 257/E21.637
(58) Field of Classification Search ........... 257/E21.616, 257/E21.635, E21.625, E21.637, 411, E29.132; 438/783, 785
See application file for complete search history.

(56) References Cited

U.S. PATENT DOCUMENTS

| | | | |
|---|---|---|---|
| 7,323,381 B2 | 1/2008 | Kadoshima et al. | |
| 7,396,777 B2 | 7/2008 | Jung et al. | |
| 2002/0113261 A1 | 8/2002 | Iwasaki et al. | |
| 2003/0067046 A1 | 4/2003 | Iwasaki et al. | |
| 2003/0176049 A1* | 9/2003 | Hegde et al. ................. | 438/591 |
| 2005/0110098 A1* | 5/2005 | Yoshihara .................... | 257/371 |
| 2006/0051880 A1 | 3/2006 | Doczy et al. | |
| 2006/0211259 A1 | 9/2006 | Maes et al. | |
| 2007/0023842 A1* | 2/2007 | Jung et al. .................... | 257/369 |
| 2007/0048989 A1 | 3/2007 | Ahn et al. | |
| 2008/0251836 A1 | 10/2008 | Park | |
| 2010/0025781 A1* | 2/2010 | Lim et al. ..................... | 257/411 |

FOREIGN PATENT DOCUMENTS

| | | |
|---|---|---|
| JP | 2006-080133 A | 3/2006 |
| JP | 2006-310801 A | 11/2006 |

\* cited by examiner

*Primary Examiner* — Caridad Everhart
(74) *Attorney, Agent, or Firm* — Miles & Stockbridge P.C.

(57) ABSTRACT

The transistor characteristics of a MIS transistor provided with a gate insulating film formed to contain oxide with a relative dielectric constant higher than that of silicon oxide are improved. After a high dielectric layer made of hafnium oxide is formed on a main surface of a semiconductor substrate, the main surface of the semiconductor substrate is heat-treated in a non-oxidation atmosphere. Next, an oxygen supplying layer made of hafnium oxide deposited by ALD and having a thickness smaller than that of the high dielectric layer is formed on the high dielectric layer, and a cap layer made of tantalum nitride is formed. Thereafter, the main surface of the semiconductor substrate is heat-treated.

15 Claims, 7 Drawing Sheets

|  | Qn | Q'n |
|---|---|---|
| EOT(nm) | 1.1 | 1.0 |
| Jg(A/cm) | $7.0 \times 10^{-2}$ | 20 |
| $\mu$ (cm$^2$/V·s) | 225 | 120 |

MANUFACTURING METHOD OF SEMICONDUCTOR DEVICE

CROSS-REFERENCE TO RELATED APPLICATION

This application is a continuation of application Ser. No. 12/116,940 filed May 7, 2008 now abandoned. The present application also claims priority from Japanese patent application No. 2007-128692 filed on May 15, 2007, the content of which is hereby incorporated by reference into this application.

TECHNICAL FIELD OF THE INVENTION

The present invention relates to a technology for manufacturing a semiconductor device. More particularly, it relates to a technology effectively applied to the manufacture of a semiconductor device provided with a MIS (Metal Insulator Semiconductor) transistor having a gate insulating film formed to contain oxide whose relative dielectric constant is higher than that of silicon oxide ($SiO_2$).

BACKGROUND OF THE INVENTION

In recent years, with the trend of scaling down the size of MIS transistors constituting a semiconductor integrated circuit, the thickness of a gate insulating film made of silicon oxide has been rapidly reduced. However, when the thickness of the gate insulating film is reduced to about 2 nm, a gate-leakage phenomenon in which electrons in a silicon substrate pass through a gate insulating film to escape to a gate electrode becomes conspicuous due to the quantum effect called direct tunneling.

Therefore, studies on the replacement of a gate insulating film material to a high dielectric material whose relative dielectric constant is higher than that of silicon oxide ($SiO_2$) have been proceeding. This is because, when a high dielectric film is used to form a gate insulating film, even if the capacitance of an equivalent silicon oxide thickness is the same, the actual physical thickness can be increased by a factor of "dielectric constant of high dielectric film/dielectric constant of silicon oxide film", and as a result, the gate-leakage current can be reduced. As a high dielectric material, oxides typified by hafnium-based oxides such as Hf—O, Hf—Si—O, Hf—Si—O—N, Hf—Al—O, and Hf—Al—O—N have been studied.

Incidentally, the inventor of the present invention has made a prior-art search based on the invented results, in the light of a first aspect of forming a gate insulating film made of a high dielectric material and a gate electrode made of a metal material and a second aspect of capping a high dielectric material forming a gate insulating film. As a result, Japanese Patent Application Laid-Open Publication No. 2006-080133 (Patent Document 1) has been extracted regarding the first aspect, and Japanese Patent Application Laid-Open Publication No. 2006-310801 (Patent Document 2) has been extracted regarding the second aspect.

The main subject of Japanese Patent Application Laid-Open Publication No. 2006-080133 (Patent Document 1) is to form a gate insulating film by using hafnium oxide which is a high dielectric material and form gate electrodes of an n channel MIS transistor and a p channel MIS transistor by using gate electrode materials suitable for the respective work functions as a whole, and metal materials are used therein for achieving the main subject. However, the Patent Document 1 does not describe the aspect of capping the high dielectric film forming the gate insulating film.

The main subject of Japanese Patent Application Laid-Open Publication No. 2006-310801 (Patent Document 2) is to solve a problem of trapping which occurs at an interface between a high dielectric film and a polysilicon film forming a gate electrode as a whole, and the gate insulating film is capped by an intermediate layer (so-called buffer layer) before forming the gate electrode for achieving the main subject.

SUMMARY OF THE INVENTION

A gate insulating film made of oxide such as hafnium-based oxide as a high dielectric material is deposited on a semiconductor substrate by Atomic Layer Deposition (ALD), Chemical Vapor Deposition (CVD), or sputtering. However, since impurities such as carbon generated from a raw material and impurities such as OH generated from $H_2O$ oxidant remain in a film deposited in this manner, a density of the film becomes relatively low, so that a dielectric constant thereof is lowered. Therefore, in the manufacture of a gate insulating film made of oxide, for example, it is necessary to perform the rapid heat treatment in a non-oxidation atmosphere after an oxide film is formed, or it is necessary to perform the heat treatment at a low temperature in an oxygen atmosphere after an oxide film is formed.

However, although an oxide film formed by the rapid heat treatment in the non-oxidation atmosphere has sufficient densification, such an oxide film has oxygen deficiency which can be one of the defect sites to cause the deterioration of transistor characteristics such as mobility. On the other hand, although an oxide film formed by the heat treatment in the oxygen atmosphere can suppress the oxygen deficiency in the heat treatment, oxygen diffuses in the oxide to reach a silicon substrate and form an interface silicon oxide layer, and as a result, the capacitance of an equivalent silicon oxide thickness is increased.

As described above, according to the studies made by the inventor of the present invention, it has been found that it is difficult to achieve both the high dielectric constant and the reduction of the oxygen deficiency in the gate insulating film formed to contain oxide deposited on a semiconductor substrate.

An object of the present invention is to provide a technology capable of improving the transistor characteristics of a MIS transistor provided with a gate insulating film formed to contain oxide whose relative dielectric constant is higher than that of silicon oxide.

Another object of the present invention is to provide a technology capable of achieving the high dielectric constant of an oxide film, the reduction of oxygen deficiency in the oxide film, and the suppression of the interface silicon oxide growth.

The above and other objects and novel characteristics of the present invention will be apparent from the description of this specification and the accompanying drawings.

The typical ones of the inventions disclosed in this application will be briefly described as follows.

According to an embodiment of the present invention, first, (a) a high dielectric layer made of oxide whose relative dielectric constant is higher than that of silicon oxide is formed on a main surface of a semiconductor substrate. Next, (b) the main surface of the semiconductor substrate is heat-treated in a non-oxidation atmosphere. Next, (c) an oxygen supplying layer made of oxide having an oxygen proportion higher than that in the high dielectric layer just after the step (b) is formed on the high dielectric layer. Then, (d) a cap layer made of metal which suppresses diffusion of oxygen is formed on the oxygen supplying layer. Next, (e) the main surface of the semiconductor substrate is heat-treated.

By this means, since the high dielectric layer is densified by the heat treatment at the step (b), the high dielectric layer with a high relative dielectric constant can be obtained. Also, since oxygen in the oxygen supplying layer is supplied to the high dielectric layer by the heat treatment at the step (e), the high dielectric layer in which the oxygen deficiency is reduced can be obtained. In other words, it is possible to obtain the oxide in which the high dielectric constant of an oxide film, the reduction of oxygen deficiency in the oxide film, and the suppression of the interface silicon oxide growth can be achieved.

Note that Japanese Patent Application Laid-Open Publication No. 2006-080133 (Patent Document 1) and Japanese Patent Application Laid-Open Publication No. 2006-310801 (Patent Document 2) do not describe the formation of the oxygen supplying layer for supplying oxygen to the high dielectric layer. Also, different from Japanese Patent Application Laid-Open Publication No. 2006-310801 (Patent Document 2), the cap layer is not used as an intermediate layer (so-called buffer layer) for preventing the trapping which occurs at an interface between a gate insulating film and a gate electrode, but it is used for preventing oxygen in the oxygen supplying layer from diffusing into the atmosphere opposite to the high dielectric layer. Since oxygen does not diffuse into the atmosphere owing to the cap layer, oxygen in the oxygen supplying layer is supplied to the high dielectric layer.

The effects obtained by typical aspects of the present invention will be briefly described below.

According to the embodiment, it is possible to improve the transistor characteristics of a MIS transistor provided with a gate insulating film formed to contain oxide whose relative dielectric constant is higher than that of silicon oxide.

BRIEF DESCRIPTIONS OF THE DRAWINGS

Figures 10, 11:
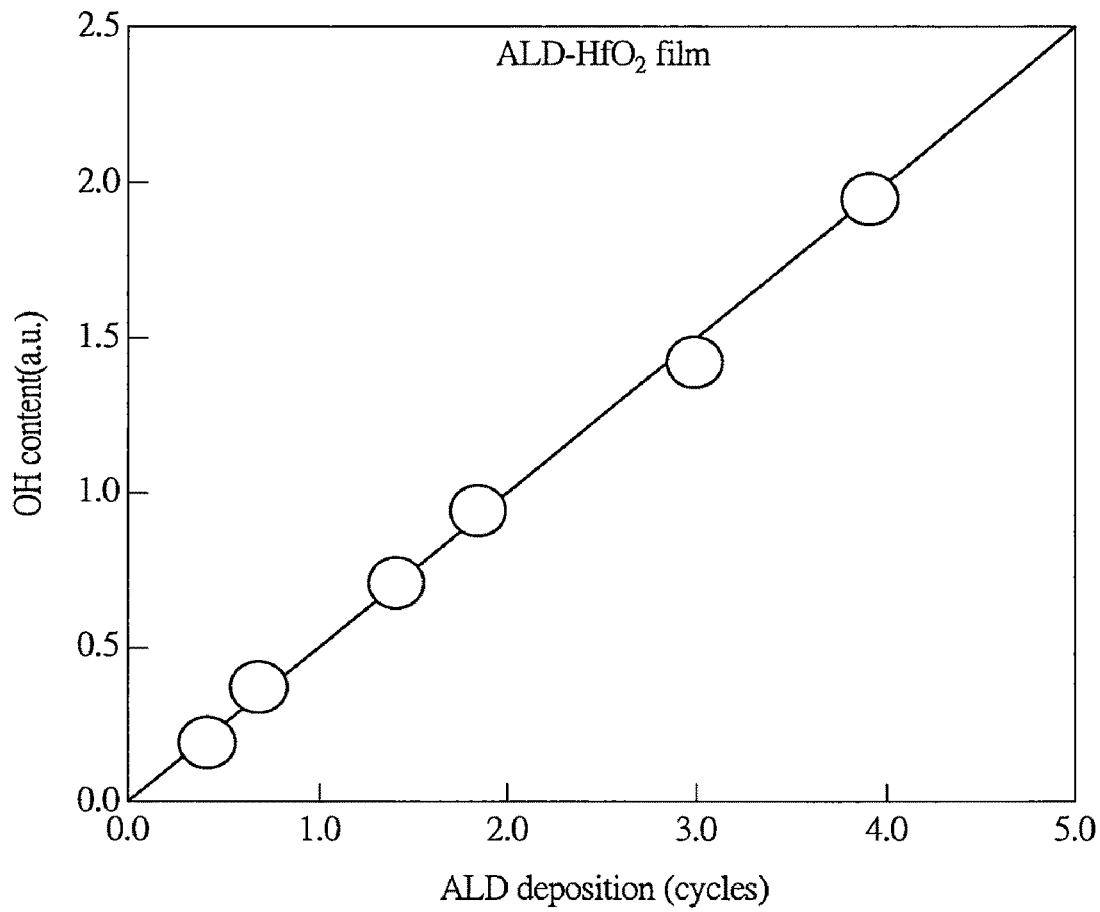
FIG. 10 is a graph showing the content of residual OH group relative to a thickness of a hafnium oxide film deposited by ALD.
Figure 12:
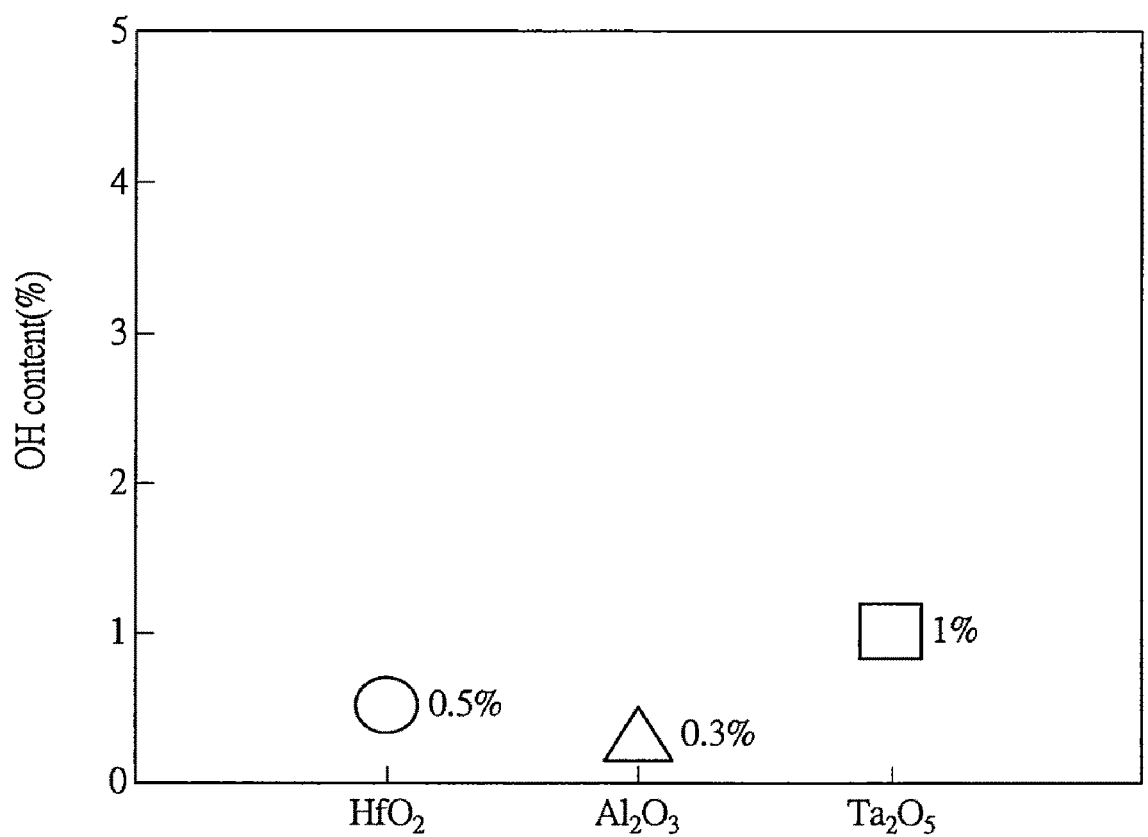

FIG. 11 is a table showing the comparison between the transistor characteristics of an n channel MIS transistor (Qn) according to the first embodiment and the transistor characteristics of an n channel MIS transistor (Q'n) studied by the inventor of the present invention; and FIG. 12 is a graph showing the content of OH group contained in various oxides deposited by ALD in a second embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiment, and the repetitive description thereof will be omitted.

First Embodiment

In the first embodiment, the present invention is applied to a manufacturing method of an n channel MIS transistor, which will be described with reference to FIG. 1 to FIG. 9. FIG. 1 to FIG. 9 are cross-sectional views schematically showing a semiconductor device in a manufacturing process, in which FIG. 2 to FIG. 6 show a principal part of the semiconductor device in an enlarged manner. Note that a p channel MIS transistor has an opposite polarity to that of an n channel MIS transistor, and the present invention can also be applied to a manufacturing method of a p channel MIS transistor.

Figure 1:
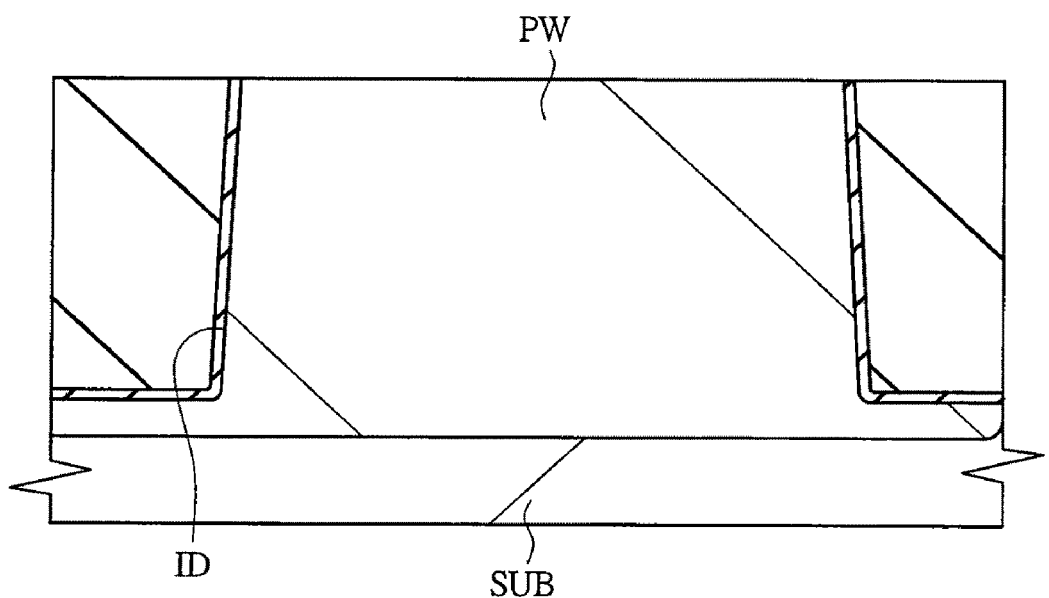
FIG. 1 is a cross-sectional view showing a semiconductor device in a manufacturing process according to a first embodiment of the present invention.

As shown in FIG. 1, element isolation trenches ID are first formed in a main surface (element formation surface) of a semiconductor substrate (hereinafter, referred to as substrate) SUB made of, for example, p type single crystal silicon by the well-known STI (Shallow Trench Isolation) technique. Next, after boron is ion-implanted in an n channel MIS transistor formation region of the substrate SUB, an impurity for adjusting a threshold voltage of the MIS transistor is ion-implanted. Then, by heat-treating the main surface of the substrate SUB, the impurity is diffused in the substrate SUB, thereby forming a p well PW in the main surface of the substrate SUB. Next, by removing a natural oxide film on the surface of the substrate SUB (p well PW) using wet etching solution such as hydrofluoric acid, the surface (silicon surface) of the substrate SUB is exposed.

Figure 2:
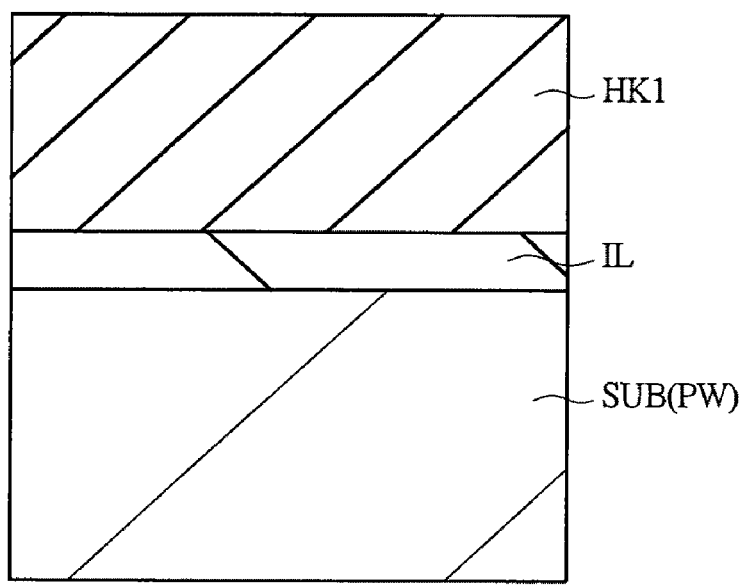
FIG. 2 is an enlarged cross-sectional view showing the semiconductor device in the manufacturing process continued from FIG. 1.

Subsequently, as shown in FIG. 2, after an interface layer IL made of silicon oxide ($SiO_2$) is formed on the main surface (surface of the p well PW) of the substrate SUB, a high dielectric layer HK1 made of oxide whose relative dielectric constant is higher than that of silicon oxide is formed on the interface layer IL. The high dielectric layer HK1 forms a gate insulating film of an n channel MIS transistor, and it is made of, for example, hafnium oxide ($HfO_2$). In the first embodiment, the interface layer IL is provided for reducing the defect generated when the high dielectric layer HK1 (hafnium oxide) is directly formed on the substrate SUB (single crystal silicon). Also, since the interface layer IL is included in the gate insulating film, it is preferable to reduce the film thickness of the interface layer IL as far as possible in order to obtain a gate insulating film with a high relative dielectric constant.

In the first embodiment, after a natural oxide film is removed using diluted hydrofluoric acid solution, the silicon oxide ($SiO_2$) forming the interface layer IL is formed by performing the high temperature thermal oxidation to the main surface of the substrate SUB at 950° C. or higher, and a film thickness of the silicon oxide is, for example, 0.3 nm.

Further, the hafnium oxide ($HfO_2$) forming the high dielectric film HK1 is deposited by Atomic Layer Deposition (ALD) using, for example, an O (oxygen) material of $H_2O$ (water) and an Hf (hafnium) material of TDMAH (Tetrakis-Dimethylamido-Hafnium: $Hf(NMe_2)_4$), and a film thickness thereof is, for example, 2.4 nm.

Here, oxides such as Hf—Si—O, Hf—Si—O—N, Hf—Al—O, Hf—Al—O—N, Hf—Ta—O, Hf—Ti—O, Hf—La—O, Hf—Y—O, Hf—Ta—Si—O, Hf—Ti—Si—O, Hf—La—Si—O and Hf—Y—Si—O can be applied as the high dielectric layer HK1 other than hafnium oxide (Hf—O). In the present invention, a material containing oxygen (O) and hafnium (Hf) and having relative dielectric constant higher than that of silicon oxide ($SiO_2$) is referred to as "hafnium-based oxide".

When the ALD is used for forming hafnium-based oxide, materials for the respective oxides are used in addition to the O material of $H_2O$ gas and the Hf material of TDMAH ($Hf(NMe_2)_4$). For example, TDMAS (Trisdimethlaminosilane: $HSi(NMe_2)_3$) is used as an Si (silicon) material. Also, TMA (Trimethylaluminum: $AlMe_3$) is used as an Al (aluminum) material. Also, TAIDEAT (tertiaryamylimidotris(dimethlamido) tantalum: $EtMe_2CNTa(NMe_2)_3$) is used as a Ta (tantalum) material. Also, TDMAT (Tetrakisdimethylaminotitanium: $Ti(NMe_2)_3$) is used as a Ti (titanium) material. Also, Trisethylcyclopentadienylyttrium: $Y(EtCp)_3$ is used as a Y (yttrium) material. Also, Trisethylcyclopentadienyllanthanum: $La(EtCp)_3$ is used as an La (lanthanum) material. Further, the nitridation of Hf—Si—O—N and Hf—Al—O—N is fabricated by the nitridation by the plasma nitrogen and the nitridation by the heat treatment using ammonia gas after depositing an Hf—Si—O film or an Hf—Al—O film by the ALD.

Also, in the first embodiment, the ALD is used for the formation of the high dielectric layer HK1, but the formation method of the high dielectric layer HK1 is not limited to this and the high dielectric layer HK1 can be formed by sputtering and CVD. Note that the oxygen supplying layer is formed at a later step by depositing the hafnium-based oxide, and the hafnium-based oxide is deposited by the ALD, not by the sputtering or CVD.

Figure 3:
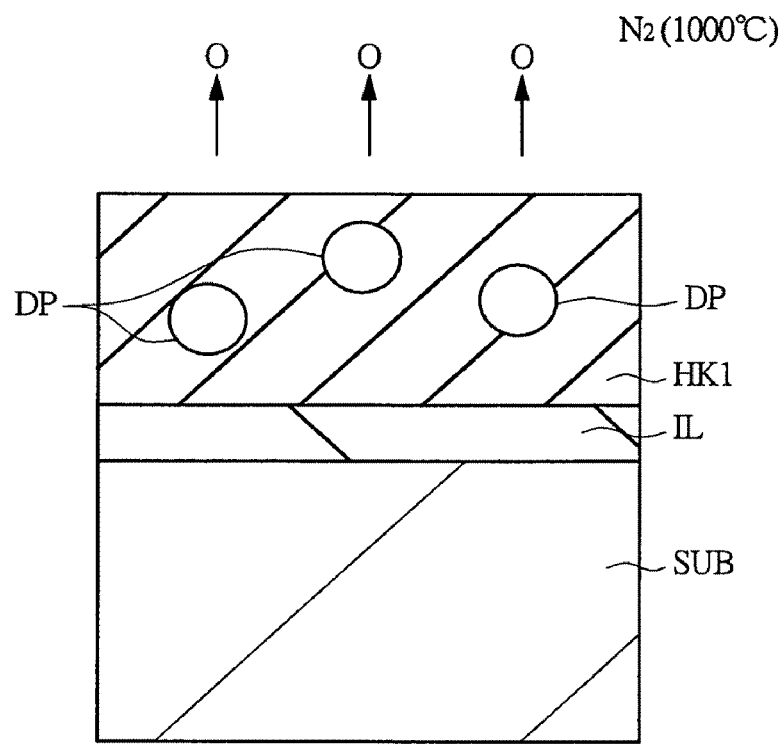
FIG. 3 is an enlarged cross-sectional view showing the semiconductor device in the manufacturing process continued from FIG. 2.

Subsequently, as shown in FIG. 3, the main surface of the substrate SUB is heat-treated in a non-oxidation atmosphere (for example, nitrogen, hydrogen, argon or the like) where an oxygen concentration is ppm (parts per million) or less in a temperature range of 600° C. to 1000° C. The high dielectric layer HK1 is densified at this step. The heat treatment for densifying the high dielectric layer HK1 is referred to as "densification annealing" in the present invention.

Since impurities such as carbon generated from a raw material and impurities such as OH generated from $H_2O$ oxidant remain in a film of the high dielectric layer HK1 just deposited, a density of the film becomes relatively low, so that the dielectric constant of the film is lowered. Therefore, by performing the densification annealing after the film formation, the densification and the high dielectric constant of the high dielectric layer HK1 can be achieved.

Further, by performing the densification annealing in a non-oxidation atmosphere, the formation of Si—O bonding at the interface of a substrate SUB (single crystal silicon) can be prevented. When the densification annealing is performed in an atmosphere containing oxygen (O), external oxygen diffuses in the high dielectric layer HK1 made of hafnium oxide and reaches the substrate SUB made of single crystal silicon, thereby forming Si—O bonding at an interface between the high dielectric layer HK1 and the substrate SUB made of single crystal silicon. As a result, a part of the gate insulating film changes to a silicon oxide film. In other words, the interface layer IL made of silicon oxide becomes thick, so that the dielectric constant of the gate insulating film lowers. Therefore, by performing the densification annealing in the non-oxidation atmosphere, the formation of Si—O bonding at an interface can be prevented.

Further, when the rapid heat treatment of Post Deposition Annealing (PDA) in which rapid heating and rapid cooling are performed (for example, 1000° C./sec) in the non-oxidation atmosphere is utilized in the densification annealing step, the high dielectric layer HK1 can be densified without increasing the film thickness of the interface layer IL made of silicon oxide.

However, if the densification annealing is performed, oxygen (O) is lost while maintaining the densification. FIG. 3 shows the case where the lost oxygen is discharged in the atmosphere, and oxygen deficient portions DP are generated in the high dielectric layer HK1. Note that the process for reducing the oxygen deficient portions DP is performed at a step (oxygen supplying annealing step) described later.

Figure 4:
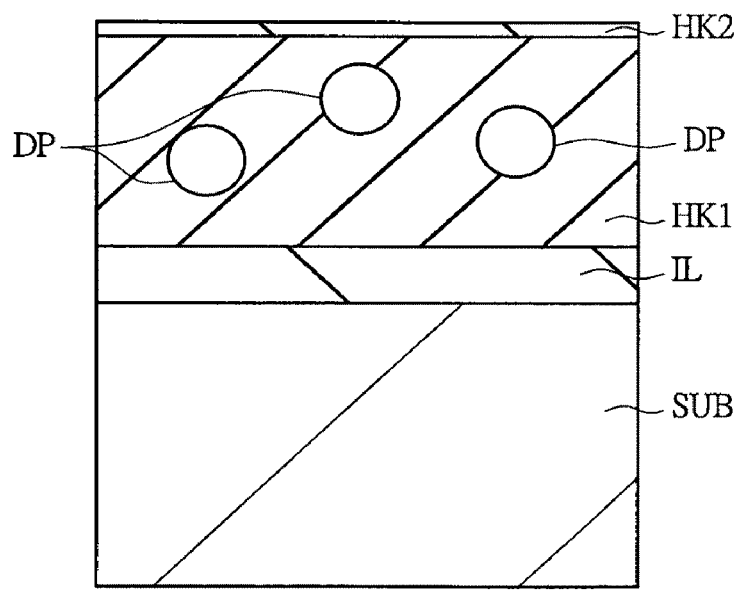
FIG. 4 is an enlarged cross-sectional view showing the semiconductor device in the manufacturing process continued from FIG. 3.

Subsequently, as shown in FIG. 4, an oxygen supplying layer HK2 made of oxide having an oxygen proportion higher than that in the high dielectric layer HK1 just after the densification annealing is formed. In the first embodiment, as the oxygen supplying layer HK2 having an oxygen proportion higher than that in the high dielectric layer HK1 just after the densification annealing in which oxygen deficiency has occurred, a hafnium-based oxide film deposited by the ALD using an O (oxygen) material of $H_2O$ and an Hf (hafnium) material of TDMAH ($Hf(NMe_2)_4$) may be applied. In the ALD, an atomic layer is deposited one by one on the substrate SUB placed in a chamber by repeating a cycle comprising the absorption of molecules of raw material compound by each monolayer, the film formation by the reaction thereof, the removal of excessive molecules by purge, the film formation by the reaction with $H_2O$ oxidant, and the removal of excessive molecules by purge. Therefore, a film thickness of the oxygen supplying layer HK2 made of a hafnium-based oxide film can be controlled by the number of cycles.

The hafnium-based oxide film deposited by the ALD quantitatively contains residual OH group. Therefore, a proportion of oxygen in the hafnium-based oxide film (oxygen supplying layer HK2) is higher than that in the hafnium-based oxide film (high dielectric layer HK1) just after the densification annealing in which oxygen deficiency has occurred. The residual oxygen functions to supplement (supply) the oxygen lost in the high dielectric layer HK1 at a step described later. In other words, the oxygen supplying layer HK2 functions as an oxygen supplying source, and an absolute supplying amount of oxygen can be adjusted by the film thickness of the oxygen supplying layer HK2. Therefore, the ALD which can control the film thickness in an atomic level is effective for the formation of the oxygen supplying layer HK2.

For example, since $H_2O$ is used as a raw material, the hafnium oxide film deposited by the ALD contains residual OH group of about 0.5%. FIG. 10 shows the content of residual OH group relative to a thickness of a hafnium oxide film deposited by the ALD. As shown in FIG. 10, it can be understood that the OH groups contained in the hafnium oxide film increase as the number of cycles, that is, the film thickness is increased. Accordingly, the absolute supplying amount is adjusted by the film thickness of the oxygen supplying layer HK2 made of hafnium oxide deposited by the ALD so that oxygen can be sufficiently supplied to the high dielectric layer HK1 in which the oxygen deficiency has occurred due to the densification annealing. In the first embodiment, the film thickness of the oxygen supplying layer HK2 made of a hafnium oxide film deposited by the ALD is adjusted to, for example, 4 Å.

Incidentally, as the method for forming hafnium-based oxide, the sputtering and the CVD are known in addition to the ALD. However, in the sputtering or the CVD, oxygen in the deposited film does not become excessive, so that the oxygen supplying layer HK2 having an oxygen proportion higher than that in the high dielectric layer HK1 just after the densification annealing in which oxygen deficiency has occurred cannot be formed. Therefore, the ALD using $H_2O$ as a material is used.

Figure 5:
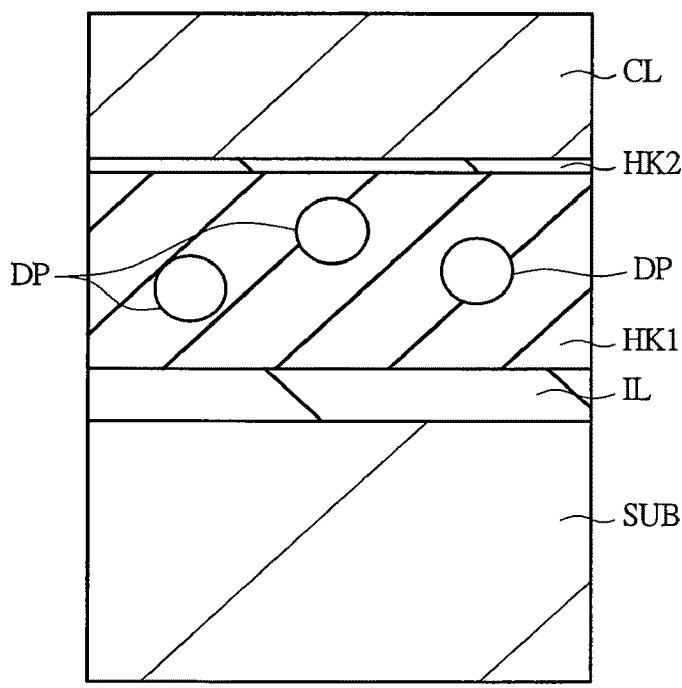
FIG. 5 is an enlarged cross-sectional view showing the semiconductor device in the manufacturing process continued from FIG. 4.

Subsequently, as shown in FIG. 5, a cap layer CL made of metal for preventing oxygen from diffusing is formed on the oxygen supplying layer HK2. In other words, the oxygen supplying layer HK2 is capped by the cap layer CL. The cap layer CL is made of a metal film (barrier metal film) provided for preventing oxygen from being discharged into atmosphere (forming a barrier) during heat treatment when the main surface of the substrate SUB is heat-treated at a later step (oxygen supplying annealing step). In the first embodiment, the cap layer CL is made of, for example, tantalum nitride (TaN) formed by sputtering, and a film thickness thereof is, for example, 20 nm.

Figure 6:
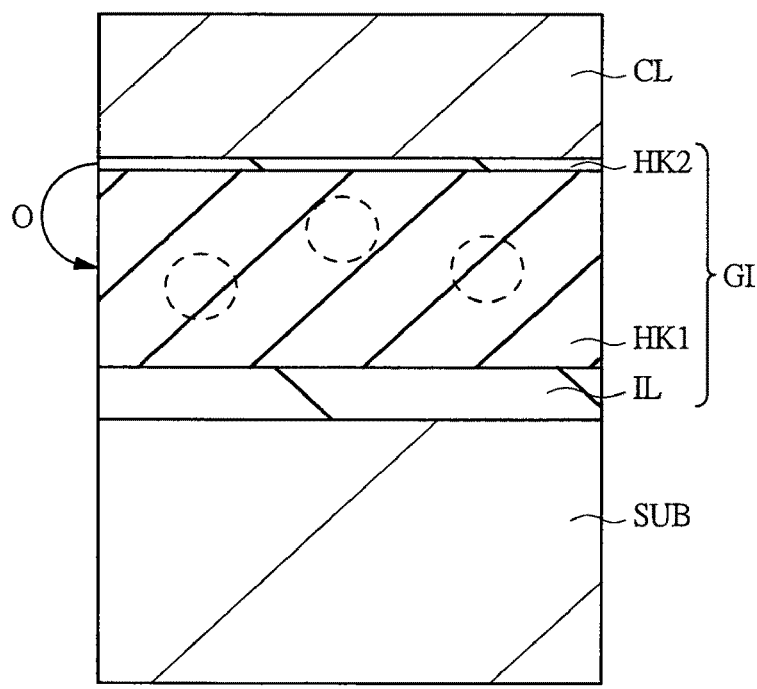
FIG. 6 is an enlarged cross-sectional view showing the semiconductor device in the manufacturing process continued from FIG. 5.

Subsequently, as shown in FIG. 6, the main surface of the substrate SUB is heat-treated in a temperature range of 950° C. to 1150° C., for example, in nitrogen ($N_2$) atmosphere. In this step, oxygen remaining in the oxygen supplying layer HK2 is supplied to the high dielectric layer HK1 to supplement the oxygen lost from the high dielectric HK1. In other words, the oxygen deficient portions DP which have occurred due to the densification annealing described with reference to FIG. 3 are reduced. Note that, in the present invention, the heat treatment for supplying oxygen to the high dielectric layer HK1 is referred to as "oxygen supplying annealing".

The high dielectric layer HK1 supplemented with oxygen in this manner forms the gate insulating film GI together with the interface layer IL and the oxygen supplying layer HK2. In the first embodiment, the hafnium-based oxide is used as a material of the oxygen supplying layer HK2, but any oxide can be used as long as it has an oxygen proportion higher than that in the high dielectric layer HK1 just after the densification annealing. However, in order to obtain the gate insulating film GI with a high dielectric constant, it is desirable that a material of the oxygen supplying layer HK2 has a relative dielectric constant higher than that of silicon oxide like hafnium-based oxide.

Although the high dielectric layer HK1 can be densified by the densification annealing, since oxygen is lost from the high dielectric layer HK1, the oxygen density of the film is lowered. When such a film with a low oxygen density is applied to the gate insulating film GI, the higher gate-leakage current flows as compared with the case where a film having a high oxygen density is applied. Therefore, by performing the oxygen supplying annealing to supplement the oxygen lost from the high dielectric layer HK1, a film with a high oxygen density can be formed, so that it is possible to suppress the flow of the gate-leakage current. Also, since a film thickness of the oxygen supplying layer HK2, that is, an oxygen supplying amount can be adjusted in the oxygen supplying annealing, oxygen does not reach the interface of the substrate SUB (single crystal silicon), and it is also possible not to increase the thickness of the interface layer IL.

Through the above-described process including the densification annealing and the oxygen supplying annealing, both the high dielectric constant and the reduction of the oxygen deficiency of the high dielectric layer HK1 forming the gate insulating film GI can be achieved.

Figure 7:
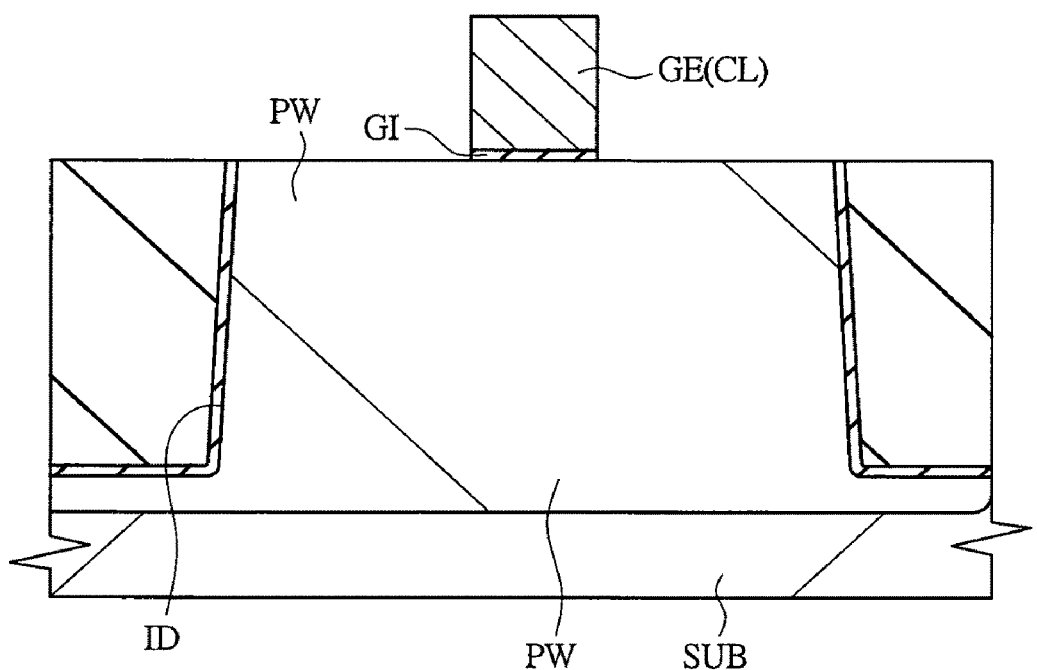
FIG. 7 is a cross-sectional view showing the semiconductor device in the manufacturing process continued from FIG. 6.

Subsequently, as shown in FIG. 7, a barrier metal film forming the cap layer CL is patterned to form a gate electrode GE made of the burrier metal film, and the gate insulating film GI other than that under the gate electrode GE is removed. Note that, in the first embodiment, the patterning for forming the gate electrode GE is performed after the oxygen supplying annealing, but it does not matter if the order is reversed.

In the first embodiment, the gate electrode GE is formed by patterning the barrier metal film forming the cap layer CL. Therefore, any barrier metal can be used for the cap layer CL as long as it functions to suppress the diffusion of oxygen and is suitable for the work function of the gate electrode GE. As the material of the cap layer CL of the n channel MIS transistor, aluminum (Al), titanium (Ti), tantalum (Ta), and the like can be used other than the tantalum nitride. Further, as the material of the cap layer CL of the p channel MIS transistor, ruthenium (Ru), platinum (Pt), nickel (Ni), and the like can be used.

Further, in the first embodiment, both the cap layer CL and the gate electrode GE are made of tantalum nitride, but the process is also available in which, after the oxygen supplying annealing is performed using tantalum nitride as the material of the cap layer CL, the tantalum nitride is removed and then the gate electrode GE is formed from a metal material having an optimal work function.

Figure 8:
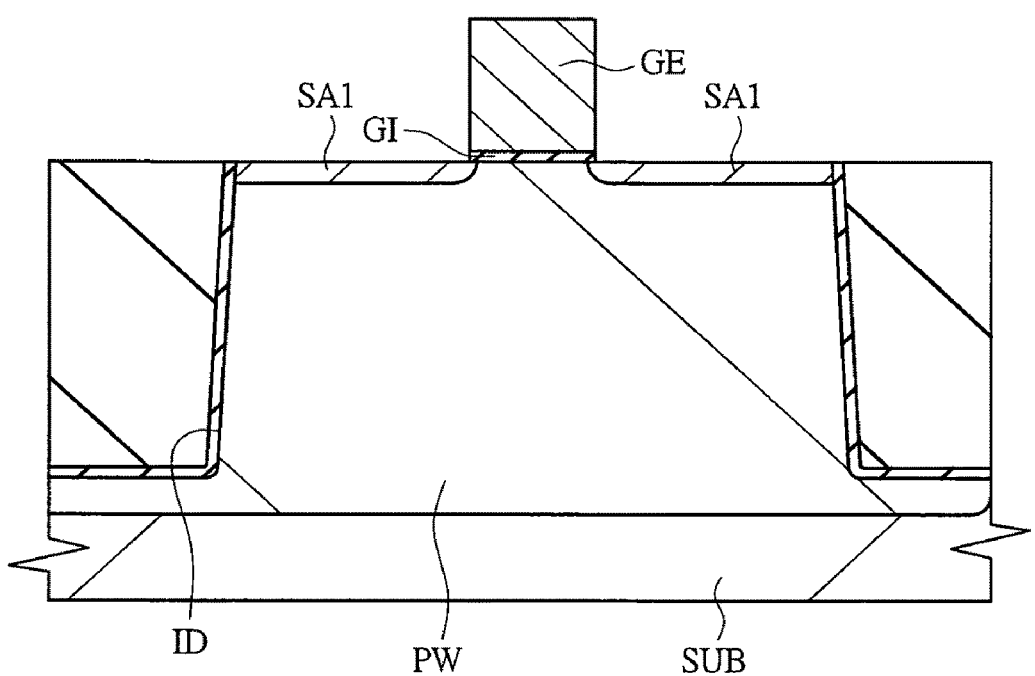
FIG. 8 is a cross-sectional view showing the semiconductor device in the manufacturing process continued from FIG. 7.

Subsequently, as shown in FIG. 8, phosphorus or arsenic is ion-implanted into a p well PW to form $n^-$ semiconductor regions SA1. The n semiconductor regions SA1 are formed to form an LDD (Lightly Doped Drain) structure of the n channel MIS transistor.

Figure 9:
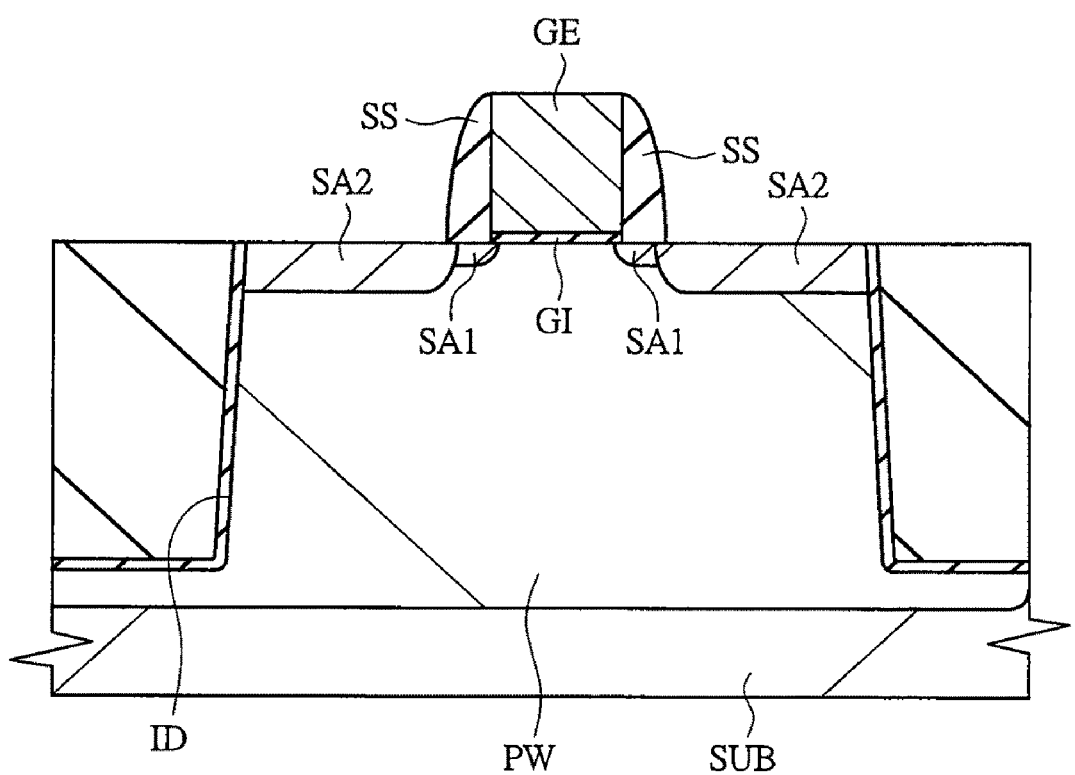
FIG. 9 is a cross-sectional view showing the semiconductor device in the manufacturing process continued from FIG. 8.

Subsequently, as shown in FIG. 9, sidewall spacers SS are formed on the sidewalls of the gate electrode GE. The sidewall spacers SS are formed by depositing a silicon oxide film on the substrate SUB by CVD and then anisotropically etching the silicon oxide film. Next, after phosphorus or arsenic is ion-implanted into the p well PW, the heat treatment is performed to the main surface of the substrate SUB to diffuse the impurity, thereby forming $n^+$ semiconductor regions (source, drain) SA2 in the p well PW. Thereafter, after a wiring step, the heat treatment (FGA: Forming Gas Annealing) is finally performed in a hydrogen atmosphere at a temperature of 400° C., so that a semiconductor device provided with an n channel MIS transistor is completed.

FIG. 11 is a table showing the comparison between the transistor characteristics of the n channel MIS transistor according to the first embodiment (Qn in the description in FIG. 11) and the transistor characteristics of the n channel MIS transistor which has been studied by the inventor of the present invention (Q'n). Note that the transistor Q'n is manufactured in the same manufacturing process as that of the transistor Qn except that the step of forming the oxygen supplying layer HK2 (hafnium oxide film with a film thickness of 4 Å deposited by the ALD) is omitted.

As shown in FIG. 11, the equivalent oxide thicknesses (EOT) of the gate insulating films GI of the transistor Qn and the transistor Q'n are about 1.1 nm and about 1.0 nm, respectively. Therefore, the transistor characteristics of the transistor Qn and the transistor Q'n can be compared. When comparing the gate-leakage current (Jg) and the electron mobility ($\mu$) between the transistor Qn and the transistor Q'n as the transistor characteristics, the gate-leakage current of the transistor Qn is lower by about three orders of magnitude than that of the transistor Q'n, and the electron mobility of the transistor Qn is about two times higher than that of the transistor Q'n.

As described above, the MIS transistor according to the first embodiment can achieve both the high dielectric constant and the reduction of the oxygen deficiency of the high dielectric layer HK1 forming the gate insulating film GI by the process including the densification annealing and the oxygen supplying annealing. Also, by forming the MIS transistor having the gate insulating film GI in which the oxygen deficiency has been suppressed, the transistor characteristics can be improved. Further, since the growth of the interface layer IL can be suppressed in the oxygen supplying annealing, a MIS transistor having a gate insulating film GI with the EOT of 1 nm or less can be formed.

Second Embodiment

Although the case where hafnium-based oxide deposited by the ALD is used in the step of forming the oxygen supplying layer has been described in the first embodiment, the case where aluminum oxide ($Al_2O_3$) deposited by the ALD or tantalum oxide ($Ta_2O_5$) deposited by the ALD is applied to form the oxygen supplying layer will be described in the second embodiment. Note that the other steps in the second embodiment are similar to those in the first embodiment.

As described in the first embodiment, the oxygen supplying layer HK2 functions to supply oxygen to the high dielectric layer HK1 in the oxygen supplying annealing in order to supplement oxygen lost in the high dielectric layer HK1. Therefore, an oxygen supplying layer which has an oxygen concentration (oxygen proportion) higher than that in the high dielectric layer HK1 just after the densification annealing in which the oxygen deficiency has occurred can be used as the oxygen supplying layer HK2. Accordingly, the oxygen supplying layer HK2 is formed by depositing aluminum oxide ($Al_2O_3$) or tantalum oxide ($Ta_2O_5$) by the ALD using an $H_2O$ as a material.

In the second embodiment, aluminum oxide ($Al_2O_3$) is deposited by the ALD using, for example, an O (oxygen) material of $H_2O$ and TMA (Trimethylaluminum: $AlMe_3$) as an Al (aluminum) material. Alternatively, tantalum oxide ($Ta_2O_5$) is deposited by the ALD using, for example, an O (oxygen) material of $H_2O$ and TAIDEAT (Tertiaryamylimidotris(dimethlamido) tantalum: $EtMe_2CNTa(NMe_2)_3$) as a Ta (tantalum) material.

FIG. 12 is a graph showing the content of OH group contained in aluminum oxide ($Al_2O_3$) and tantalum oxide ($Ta_2O_5$) deposited by the ALD. FIG. 12 also shows the content of OH group contained in hafnium oxide ($HfO_2$) used as the oxygen supplying layer HK2 in the first embodiment.

As shown in FIG. 12, it can be understood that about 0.5% of OH group is contained in $HfO_2$, about 0.3% of OH group is contained in $Al_2O_3$, and about 1% of OH group is contained in $Ta_2O_5$. The OH group acts as an oxygen supplying source, so that an absolute supplying amount relative to a certain amount of oxygen deficiency in the high dielectric layer HK1 just after the densification annealing can be adjusted by the film thickness. Note that, when oxygen is supplied to the high dielectric layer HK1 including a certain amount of oxygen deficiency, the film thickness of $Ta_2O_5$ containing about 1% of OH group may be about half the thickness of $HfO_2$ containing about 0.5% of OH group.

Although the high dielectric layer HK1 can be densified by the densification annealing, since oxygen is lost from the high dielectric layer HK1, the oxygen density of the film is lowered. Therefore, by performing the oxygen supplying annealing to supplement the oxygen lost from the high dielectric layer HK1, a film with a high oxygen density can be formed, so that it is possible to suppress the flow of the gate-leakage current. In other words, by forming the gate insulating film GI in which the oxygen deficiency has been suppressed, the transistor characteristics can be improved.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the above-mentioned embodiments, the hafnium-based oxide (Hf—O) has been shown as the material of the high dielectric layer. However, the high dielectric layer made of aluminum oxide ($Al_2O_3$), tantalum oxide ($Ta_2O_5$), titanium oxide ($TiO_2$), lanthanum oxide ($La_2O_3$), or zirconium oxide ($ZrO_2$) is also available. Similar to the hafnium-based oxide shown in the above-mentioned embodiments, the oxygen deficiency occurs due to the heat treatment in the high dielectric layer made of aluminum oxide, tantalum oxide, titanium oxide, lanthanum oxide, or zirconium oxide. However, oxygen in the oxygen supplying layer is supplied to aluminum oxide, tantalum oxide, titanium oxide, lanthanum oxide, and zirconium oxide forming the high dielectric layer, so that both the high dielectric constant of the high dielectric layer and the reduction of the oxygen deficiency in the high dielectric layer can be achieved.

The present invention is widely utilized in a manufacture of semiconductor devices. In particular, it is utilized for manufacturing semiconductor devices having excellent transistor characteristics in the 32-nm technology and beyond.

What is claimed is:

1. A manufacturing method of a semiconductor device comprising steps of:
    before the step (a), forming a silicon oxide film over the semiconductor substrate;
    (a) forming a first layer over a semiconductor substrate;
    (b) after the step (a), forming a second layer over the first layer; and
    (c) after the step (b), forming a cap layer over the second layer,
    wherein the first and second layers compose a gate insulating film of a MIS transistor,
    wherein the cap layer composes a gate electrode of the MIS transistor,
    wherein the first layer includes Hf and O,
    wherein the second layer includes either Al and O or Ta and O,
    wherein a thickness of the second layer is smaller than a thickness of the first layer,
    wherein a thickness of the silicon oxide film is smaller than a thickness of the first layer, and
    wherein a thickness of the second layer is smaller than a thickness of the silicon oxide film.

2. A manufacturing method of a semiconductor device according to claim 1,
    wherein, in the step (b), the second layer is formed by ALD method.

3. A manufacturing method of a semiconductor device according to claim 1,
    wherein, in the step (a), the first layer is formed by ALD method.

4. A manufacturing method of a semiconductor device according to claim 1,
    wherein the cap layer is made of a metal film.

5. A manufacturing method of a semiconductor device according to claim 1, wherein the MIS transistor is an n-channel MIS transistor, and wherein the cap layer is made of a tantalum nitride film, an aluminum film, a titanium film, or a tantalum film.

6. A manufacturing method of a semiconductor device according to claim 1, wherein the MIS transistor is a p-channel MIS transistor, and wherein the cap layer is made of a ruthenium film, a platinum film, or a nickel film.

7. A manufacturing method of a semiconductor device according to claim 1, further comprising a step of:

(d) between the step (a) and (b), heat-treating a main surface of the semiconductor substrate in a non-oxidation atmosphere.

8. A manufacturing method of a semiconductor device according to claim 7, wherein the first layer is densified by the step (d).

9. A manufacturing method of a semiconductor device according to claim 8, wherein, in the step (b), the second layer has an oxygen proportion higher than that in the first layer just after the step (e).

10. A manufacturing method of a semiconductor device according to claim 1, further comprising a step of:

(e) after the step (c), heat-treating a main surface of the semiconductor substrate.

11. A manufacturing method of a semiconductor device according to claim 10, wherein oxygen is supplied from the second layer to the first layer by the step (e).

12. A semiconductor device comprising:

a first layer formed over a semiconductor substrate;

a second layer formed over the first layer;

a cap layer formed over the second layer; and a silicon oxide film disposed between the semiconductor substrate and the first layer, wherein the first and second layers compose a gate insulating film of a MIS transistor, wherein the cap layer composes a gate electrode of the MIS transistor, wherein the first layer includes Hf and O, wherein the second layer includes either Al and O or Ta and O, wherein a thickness of the second layer is smaller than a thickness of the first layer, and wherein a thickness of the silicon oxide film is smaller than a thickness of the first layer, and wherein a thickness of the second layer is smaller than a thickness of the silicon oxide film.

13. A semiconductor device according to claim 12, wherein the cap layer is made of a metal film.

14. A semiconductor device according to claim 12, wherein the MIS transistor is an n-channel MIS transistor, and wherein the cap layer is made of a tantalum nitride film, an aluminum film, a titanium film, or a tantalum film.

15. A semiconductor device according to claim 12, wherein the MIS transistor is a p-channel MIS transistor, and wherein the cap layer is made of a ruthenium film, a platinum film, or a nickel film.

* * * * *